United States Patent [19]

Hoffman

[11] Patent Number: 5,409,548
[45] Date of Patent: Apr. 25, 1995

[54] FERROELECTRIC DETECTOR ARRAY UTILIZING MATERIAL AND FABRICATION TECHNIQUE

[75] Inventor: Robert C. Hoffman, Chantilly, Va.

[73] Assignee: The United States of America as represented by the Secretary of the Army, Washington, D.C.

[21] Appl. No.: 234,798

[22] Filed: Apr. 28, 1994

Related U.S. Application Data

[63] Continuation of Ser. No. 62,518, May 17, 1993, abandoned.

[51] Int. Cl.$^6$ .............................................. H01L 37/02
[52] U.S. Cl. ..................... 136/213; 136/239; 136/240; 501/134
[58] Field of Search .............. 136/201, 213, 214, 215, 136/238, 239, 240; 501/134

[56] References Cited

U.S. PATENT DOCUMENTS

| | | | |
|---|---|---|---|
| H626 | 4/1989 | Covino | 501/12 |
| 2,584,324 | 2/1952 | Bousky | 106/39 |
| 2,954,300 | 9/1960 | Triebwasser | 106/39 |
| 3,604,933 | 9/1971 | Cross | 250/83.3 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,379,232 | 4/1983 | Hopper | 250/332 |
| 4,547,792 | 10/1985 | Sclar | 357/45 |
| 4,742,031 | 5/1988 | Ohya et al. | 501/134 |
| 4,829,030 | 5/1989 | Ohya et al. | 501/134 |
| 4,840,926 | 6/1989 | Saburi et al. | 501/134 |
| 4,894,544 | 1/1990 | Turnbull | 250/338.3 |
| 4,922,116 | 5/1990 | Grinberg et al. | 250/495.1 |
| 4,926,051 | 5/1990 | Turnbull | 250/332 |
| 4,963,390 | 10/1990 | Lipeles et al. | 427/110 |
| 5,008,541 | 4/1991 | Audaire et al. | 250/338.3 |
| 5,079,197 | 1/1992 | Ushida et al. | 501/136 |
| 5,079,200 | 1/1992 | Jackson | 501/136 |
| 5,091,348 | 2/1992 | Woodhead et al. | 501/136 |
| 5,109,158 | 4/1992 | Horne | 250/332 |
| 5,122,666 | 6/1992 | Turnbull | 250/338.3 |
| 5,138,520 | 8/1992 | McMillan et al. | 361/311 |
| 5,217,754 | 6/1993 | Santiago-Aviles et al. | 427/226 |
| 5,270,298 | 12/1993 | Ramesh | 505/1 |
| 5,271,955 | 12/1993 | Maniar | 427/100 |
| 5,272,341 | 12/1993 | Micheli et al. | 250/338.3 |

Primary Examiner—Donald P. Walsh
Assistant Examiner—Chrisman D. Carroll
Attorney, Agent, or Firm—Milton W. Lee; Alain L. Bashore; Anthony T. Lane

[57] ABSTRACT

A ferroelectric material, its fabrication technique, and use as a detector material, in a ferroelectric detector array is disclosed. The material is an alloy of essential pure components of $Pb_2(Fe, Nb)O_2$ and $Pb_2(Fe, Ta)O_2$ each with respective Curie temperatures. An essentially linear relationship is made for mole fraction compositions versus Curie temperatures of each component in the alloy, between the pure mole fractions and respective Curie temperatures of the pure components. A Curie temperature for the composition of $Pb_2(Fe, [Ta_{(1-x)}, Nb_x])O_6$ is determined, where x is the mole fraction of $Pb_2(Fe,Nb)O_2$ and $1-x$ is the mole fraction of $Pb_2(Fe, Ta)O_2$, with x having a value greater than zero and less than one.

1 Claim, 3 Drawing Sheets

FERROELECTRIC DETECTOR ARRAY UTILIZING MATERIAL AND FABRICATION TECHNIQUE

This application is a continuation of application Ser. No. 08/062,518, filed 17 May 1993, now abandoned.

BACKGROUND OF INVENTION

1. Field of the Invention

The present invention generally relates to ferroelectric detector array, more specifically, to a ferroelectric detector array utilizing a lead iron-tantalate-niobate alloy and its fabrication.

2. Description of Related Prior Art

Certain crystals exhibit a property to produce a state of electrical polarity with a change in temperature, which is described as the pyroelectric effect. Ferroelectric materials are a type of pyroelectric materials where this polarization, described as a permanent spontaneous electrical polarization, can be reversed by an electric field. The spontaneous polarization is reversible due to the derivation of the crystal from a nonpolarized structure by small displacements of ions. This nonpolarized structure becomes stable if the crystal is heated above a critical temperature, known as the Curie temperature or transition point. The crystal undergoes a phase transition from the polarized or ferroelectric phase, into an unpolarized or paraelectric phase at the Curie temperature. During this transition, large anomalies occur in the dielectric constant such that small changes in temperature of the material result as large changes in the dielectric constant. The temperature dependence of the spontaneous polarization corresponds to a strong pyroelectric effect which can be exploited for different applications.

Ferroelectrics are utilized as electromechanical transducers, light modulators, optical information storage, and in particular, thermal image detectors. Thermal image detectors require detector materials which detect small changes in temperature detectable electronically for which ferroelectric materials are ideally suited. With such a material changes in thermal energy can be detected as the material passes through the transition point, which also results in large changes in the dielectric constant or electronic capacitance. These dramatic changes in values constitute an electronic signal. When this material is made into an array of small detectors, the resulting electronic signals from all the detectors form an electronic image of the thermal scene. The correct choice of ferroelectric material and its fabrication technique is a primary consideration for a ferroelectric detector array utilized in a thermal imaging system.

The transition point of typical ferroelectric materials are extremely low such that a cooler is required to bring the detector material to its transition point (Tc) to be utilized although that point may be below the desired operational range to be useful. The prohibitive size and weight a cooler would add a consideration in the design of a thermal imaging system. By selecting proper amounts of two related ferroelectric materials (compositionally tuning Tc) the solid solution of the two materials may be fabricated as a ferroelectric alloy material which has a specific Curie temperature or transition point. One example of this type of material is barium strontium titanate (BST) which has a Tc of 25 degrees Celsius that is the resultant alloy of barium titanate having a Tc of 120 degrees Celsius with strontium titanate having a Tc of −220 degrees Celsius. The principal difficulty with materials such as $BaTiO_3$ and BST, discussed above, is that their high dielectric constant reduces the figure-of-merit (FOM) and in turn the ultimate device performance. Other ferroelectric materials such as $PbTiO_3$, PZT, and PZT do no have the feature of having Tc compositionally tunable, in spite of a sufficient FOM. There is a continual search for new ferroelectric materials utilized in ferroelectric detector arrays which advance the state of the art in sensitivity and resolution of small, lightweight, uncooled thermal imaging systems.

While the prior art has reported using ferroelectric materials as thin film detector array materials, none have established a basic for a specific material and its fabrication that is dedicated to the task of resolving the particular problem at hand.

What is needed in this instance is a lead iron-tantalate-niobate alloy detector array utilizing a ferroelectric with a compositionally selectable Curie point and low dielectric constant.

SUMMARY OF THE INVENTION

It is therefore the primary object of the invention to provide a lead iron-tantalate-niobate alloy detector array utilizing a ferroelectric and fabrication technique with compositionally selectable Curie point and low dielectric constant in a detector array.

According to the invention, there is disclosed a ferroelectric detector array utilizing lead iron-tantalate-niobate alloy composition as the ferroelectric material and its fabrication technique. The composition of the alloy is compositionally "tunable" for any Curie temperature desired. An essentially linear relationship is determined between mole fraction (or percent) composition versus Curie temperatures of each component in the alloy, between the pure mole fractions and respective Curie temperatures of the components. A Curie temperature is selected for the ferroelectric material between the Curie temperature of the respective components. From the relationship there is obtained a mole fraction of one of the components thereby setting the mole fraction of the other component.

Metalorganic solutions are mixed in solutions so as to dissolve constituent components. The dissolved solution is deposited onto a substrate which is then spun to form an organic film. The film is then heated to dry the organic film and further heated to decompose the organic. Annealing the decomposed organic film is accomplished and slow cooling through the transition point whereby a thin film ferroelectric alloy is formed with a perovskite structure of single phase material of substantially uniform composition.

A plurality of elements of the ferroelectric alloy in thin film are utilized in the present embodiment within a ferroelectric detector array for use in an infrared imager. The elements are mounted on one side of a membrane which absorbs incoming radiation substantially without reflection, conducts the incoming radiation to the elements and provides support for each element mounted to the membrane. The other side of each element is mounted to a conductive electrode element to substantially neutralize accumulated surface charge of that element. A separate conductive heat dissipating element parallel to each conductive electrode element, with a small fraction of which is bonded to an exposed surface area of the conductive electrode element. An insulating element is situated in between the conductive electrode element and the conductive heat dissipating element, which supports the heat dissipating element without conducting heat back to the conductive element. Electrical connection is achieved by a soldering terminal attached to each conductive metal heat dissipating element. When incoming radiation impinges upon the one side of the membrane there is a measurable electrical difference from each conductive metal heat dissipating element.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT

Figure 1:
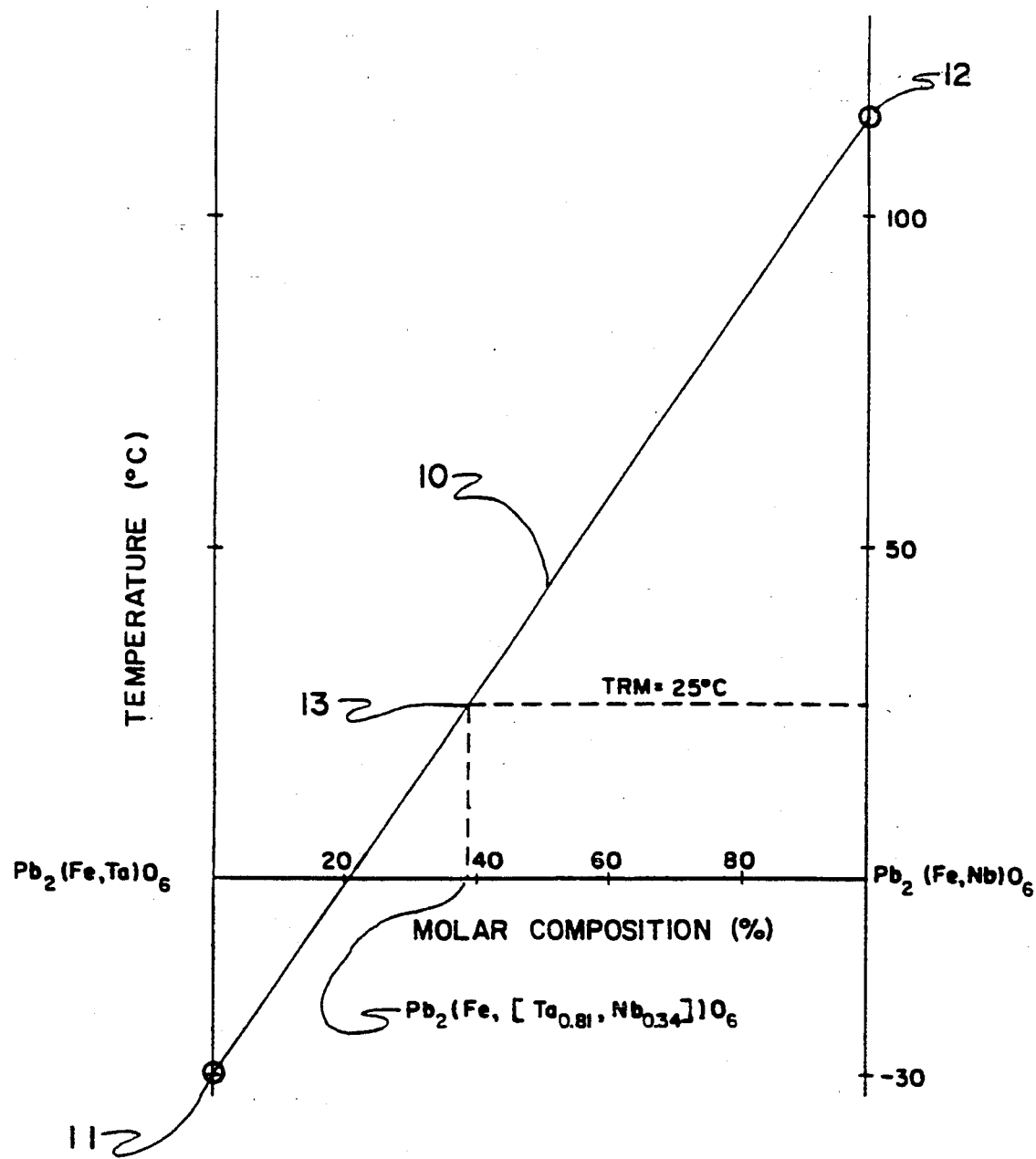
FIG. 1 is a graph of Curie temperatures versus molar composition for solid solutions of $Pb_2(Fe, Ta)O_6$ and $Pb_2(Fe, Nb)O_6$.

Referring now to the drawings, and more particularly to FIG. 1 there is shown a broad range of solid solutions of lead iron tantalate [$Pb_2(Fe, Ta)O_6$] and lead iron niobate [$Pb_2(Fe, Nb)O_6$] formed in alloy with line 10 designated as the percent molar composition. Point 11 is the known Curie point for pure lead iron niobate which is −30 degrees celsius, and point 12 is the known Curie point for pure lead iron tantalate which is 114 degrees celsius. Line 10 has been found experimentally to be an essentially linear relationship to Curie temperature between points 11 and 12. Alloying these two materials to a desired composition provides a ferroelectric material with a Curie point shown in FIG. 1 as between points 11 and 12. The material is a perovskite-class material having the general composition: $A_2(B^{+3},B^{+5})O_6$. Because of the charge compensation between the Fe and Ta (or Nb) ions, only a 1:1 ratio of Fe to Ta (or Nb) is stable in this material. There results a generic formula for the alloy of these two materials as:

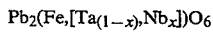

$Pb_2(Fe,[Ta_{(1-x)},Nb_x])O_6$ where x is the mole fraction of lead iron niobate and 1−x is the mole fraction of lead iron tantalate. X has a value greater than zero and less than one, with a direct correspondence to a Curie temperature. The material is also characterized as a single phase material of uniform composition.

The alloy is compositionally determined for the Curie temperature desired. A graphical representation or its equivalent is determined of the Curie temperature versus the mole fraction compositions of the components of the ferroelectric alloy, which approximates a lineal relationship between the pure mole fractions and corresponding Curie temperatures of each respective component of the selected ferroelectric alloy. A Curie temperature is selected for the ferroelectric material between the Curie temperature of the respective components. From the relationship there is obtained a mole fraction of one of the components thereby setting the mole fraction of the other component. For a room temperature Curie point selected, such that there is a single phase material of uniform composition, has been found to be a molar composition of 61% lead iron tantalate and 39% lead iron niobate designated by point 13 on FIG. 1. This material alloyed as the composition:

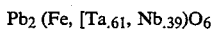

$Pb_2(Fe, [Ta_{.61}, Nb_{.39}])O_6$ has a ferroelectric-to-paraelectric transition, or Curie temperature of 26 degrees celsius as lead iron-tantalate-niobate alloy.

The resultant alloy is a significant advancement in the art of ferroelectric materials. The lead iron-tantalate-niobate alloy has a lower dielectric constant and a higher pyroelectric coefficient than $BaTiO_3$ or BST, resulting in a higher FOM and higher device performance. The alloy of the present invention has an approximate dielectric constant of 200 which is at least an order of magnitude difference with the prior art, such as $BaTiO_3$ which has a dielectric constant of 2000. This order of magnitude difference, along with a Tc which is compositionally adjustable allows the alloy of this invention to be extremely suitable as a thermal detector and imager material. For use in thin-film form there is next described the thin-film fabrication technique of the material.

Figure 2:
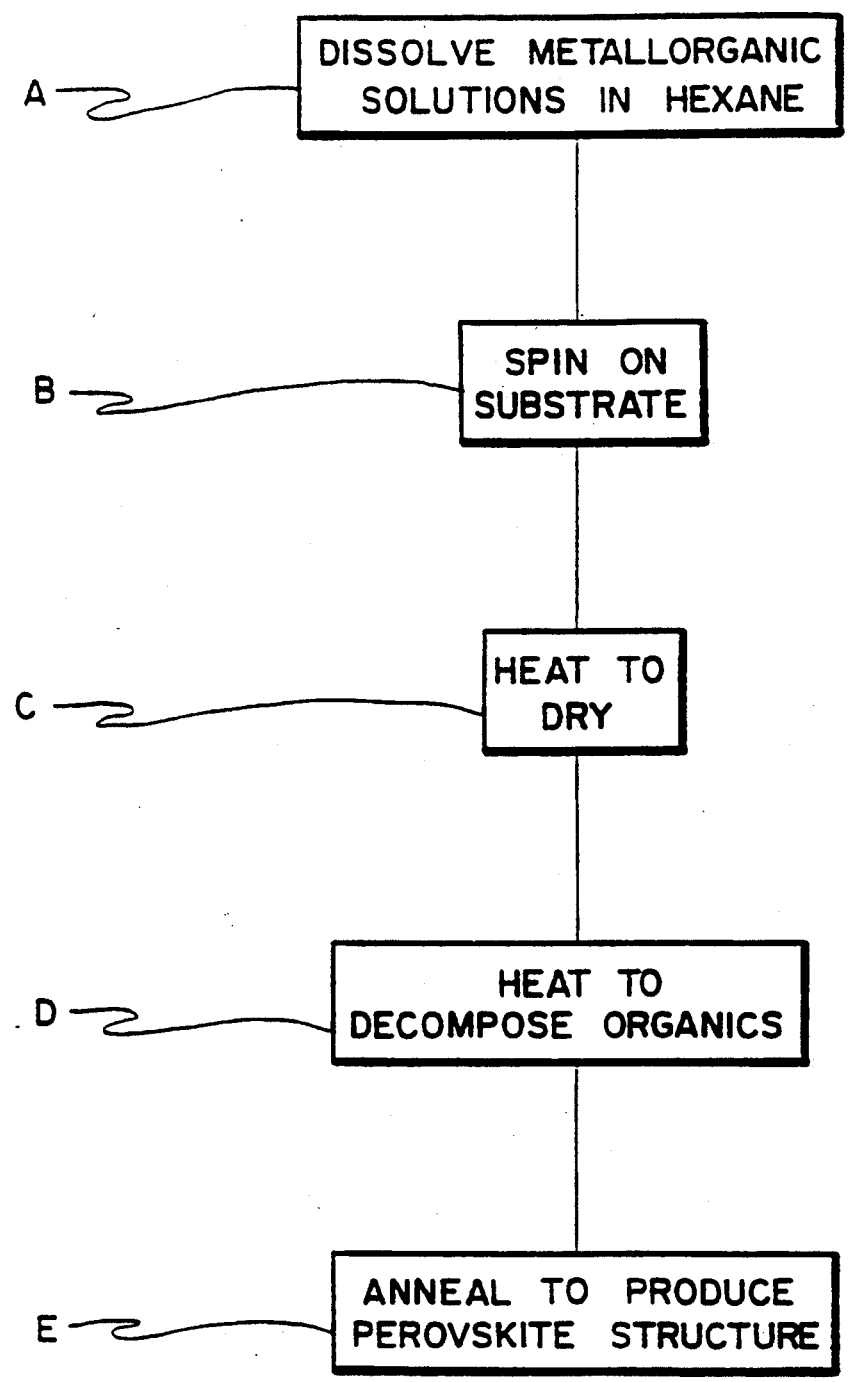
FIG. 2 is a flow chart diagram of the thin-film fabrication technique in the preferred embodiment as the sol-gel technique.

FIG. 2 shows the generalized flow chart for the steps of the sol-gel technique utilized as the thin film formation technique of the preferred embodiment. In step A, metallorganic solutions of lead 2-ethyl hexoxide, iron isopropoxide, niobium ethoxide and tantalum ethoxide is dissolved in 0.25 M hexane. The dissolved solution is then filtered with a 0.2 micrometer syringe filter and in step B deposited onto a substrate and spun at 2000 to 4000 RPM using a photoresist spinner to form a film. The film is dried in step C at 150 degrees Celsius for 30 min. and then heated to 400 degrees Celsius in step D for 30 min to decompose the organic materials to form an amorphous $Pb[Fe(Ta,Nb)]O_6$ thin film. Final annealing in step E at 500 to 750 degrees Celsius for 60 min. followed by slow cooling at 10 degrees Celsius per min, through the transition yields a thin film with a perovskite structure. It is understood that the invention is not limited to the thin-film technique of the present embodiment, but that other thin film techniques may be utilized including MOCVD, conventional flux, and crystal pulling techniques.

Figure 3:
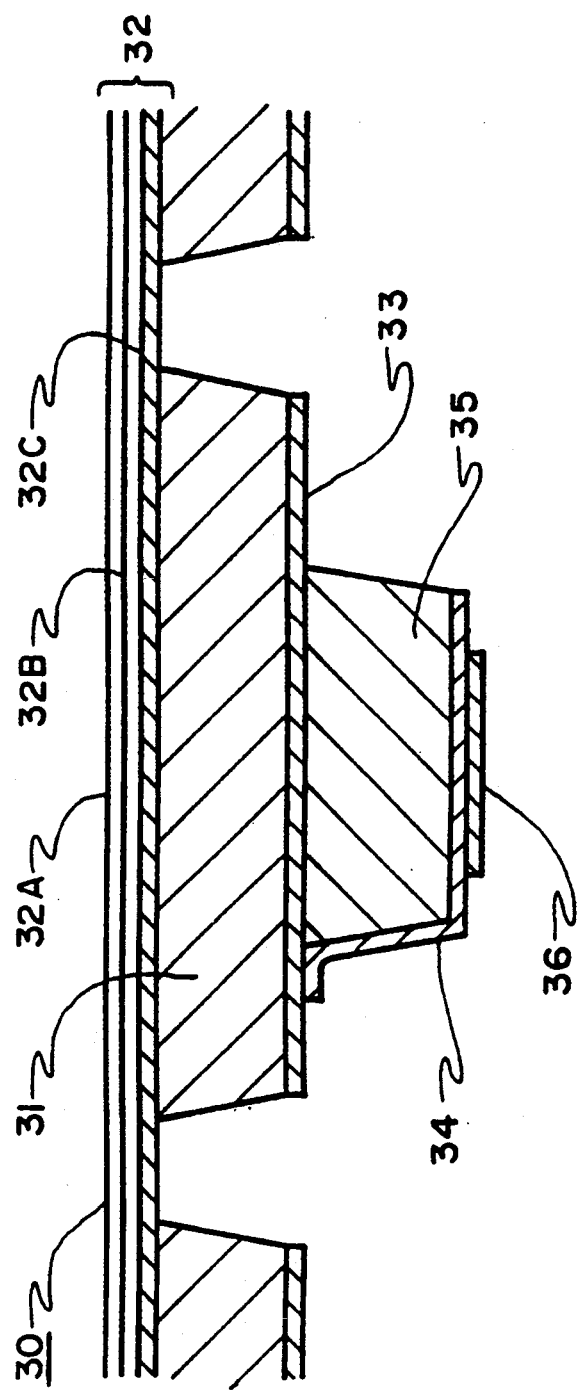
FIG. 3 is a schematic of the material of the present invention fabricated in the present embodiment as a thin film detector array.

FIG. 3 shows a schematic of the material fabricated as a thin film detector material in a ferroelectric detector array 30 as used in solid state infrared imagers. Array 30 consists of a plurality of small ferroelectric elements 31 mounted on a membrane 32. Outer layer 32a of the membrane is an absorber such as lampblack in a suitable binder to efficiently absorb the incoming radiation without reflection. Under layer 32a is a support layer 32b and a thin common electrical conductive layer 32c. Each ferroelectric element also has an individual conductive electrode element 33 to neutralize only the accumulated surface charge of that element. A separate conductive metal heat dissipating element 34 is bonded to a small fraction of the exposed surface area of the electrode. An insulating element 35 between elements 33 and 34 supports the latter without conducting heat back to element 33. A soldering terminal 36 completes the structure with a higher figure-of-merit. This film of a lead based ferroelectric 30 will decrease noise and increase sensitivity, resulting in higher overall performance.

While this invention has been described in terms of the preferred embodiment consisting of use as a detector material in a detector array, those skilled in the art will recognize that the invention can be practiced with modification within the spirit and scope of the appended claims.

I claim:

1. A ferroelectric detector array for use in an infrared imager wherein a plurality of ferroelectric material elements each with two sides that are each mounted on one side to a membrane which absorbs incoming radiation substantially without reflection, conducts the incoming radiation to the elements, and provides support for each element mounted to the membrane, further wherein on the other side of each element is mounted a conductive electrode element to substantially neutralize accumulated surface charge of that element, a separate conductive heat dissipating element substantially parallel to each conductive electrode element, a small fraction of which is bonded to an exposed surface area of the conductive electrode element, an insulating element situated in between the conductive electrode element and the conductive heat dissipating element, which supports the heat dissipating element without conducting heat back to the conductive element, a soldering terminal is attached to each conductive metal heat dissipating element for terminal connection such that when incoming radiation impinges upon the one side of the membrane there is a measurable electrical difference from each conductive metal heat dissipating element, the ferroelectric material is an alloy of two essentially pure components each with respective Curie temperatures, with an essentially linear relationship between mole fraction compositions and Curie temperatures of each component, whereby selecting a mole fraction of one of the components will thereby set the mole fraction of the other component and a respective Curie temperature, the material comprising:

a composition of $Pb_2(Fe, [Ta_{(1-x)}, Nb_x])O_6$, where x is the mole fraction of $Pb_2(Fe,Nb)O_6$ and $1-x$ is the mole fraction of $Pb_2(Fe, Ta)O_6$, with x having a value greater than zero and less than one.

* * * * *